United States Patent
James-Roxby et al.

(10) Patent No.: US 8,122,239 B1
(45) Date of Patent: Feb. 21, 2012

(54) METHOD AND APPARATUS FOR INITIALIZING A SYSTEM CONFIGURED IN A PROGRAMMABLE LOGIC DEVICE

(75) Inventors: Philip B. James-Roxby, Longmont, CO (US); Stephen A. Neuendorffer, San Jose, CA (US); Henry E. Styles, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 546 days.

(21) Appl. No.: 12/208,452

(22) Filed: Sep. 11, 2008

(51) Int. Cl.
*G01R 31/28* (2006.01)
*G06F 15/177* (2006.01)
*G06F 11/30* (2006.01)
*G06F 15/16* (2006.01)
*G06F 9/30* (2006.01)
*G06F 7/38* (2006.01)

(52) U.S. Cl. ............. 713/100; 713/1; 713/200; 326/38; 326/41; 712/217; 712/228; 712/241; 365/189.08; 235/462.1; 709/251; 714/727

(58) Field of Classification Search .............. 713/1, 200; 235/462.1; 712/217, 241, 228; 365/189.08; 326/38, 41; 709/251; 714/727
See application file for complete search history.

(56) References Cited

U.S. PATENT DOCUMENTS

| | | | |
|---|---|---|---|
| 6,678,847 B1* | 1/2004 | Perry et al. ............... | 714/727 |
| 6,897,676 B1* | 5/2005 | Pang ........................ | 326/38 |
| 7,039,793 B2* | 5/2006 | Col et al. .................. | 712/241 |
| 7,314,174 B1* | 1/2008 | Vadi et al. ................ | 235/462.1 |
| 2001/0017793 A1* | 8/2001 | Sample et al. ........... | 365/189.08 |
| 2002/0087837 A1* | 7/2002 | Samra et al. ............. | 712/217 |
| 2003/0212830 A1* | 11/2003 | Greenblat et al. ....... | 709/251 |
| 2004/0194109 A1* | 9/2004 | Boros et al. ............. | 718/107 |
| 2004/0230784 A1* | 11/2004 | Cohen ..................... | 713/1 |
| 2006/0294344 A1* | 12/2006 | Hsu et al. ................. | 712/228 |
| 2009/0031319 A1* | 1/2009 | Fecioru ................... | 718/103 |

OTHER PUBLICATIONS

Bogdanov, A. et al., "A Parallel Hardware Architecture for fast Gaussian Elimination over GF(2)," *Proc. of the 14th Annual Symposium on Field-Programmable Custom Computing Machines (FCCM'06)*, Apr. 24-26, 2006, pp. 237-246, Napa Valley, California, USA.

Mencer, Oskar et al., "Hagar: Efficient Multi-context Graph Processors," *Field-Programmable Logic and Applications: Reconfigurable Computing is Going Mainstream*, copyright 2002, pp. 915-924, published by Springer-Verlag Berlin, Heidelberg, Germany.

* cited by examiner

*Primary Examiner* — Thomas Lee
*Assistant Examiner* — Aurel Prifti
(74) *Attorney, Agent, or Firm* — Robert M. Brush; LeRoy D. Maunu

(57) ABSTRACT

Method and apparatus for initializing a system configured in a programmable logic device (PLD) is described. In some examples, the method includes: initializing memory elements in the system with first data; executing a first iteration of the system to process the first data; partially reconfiguring the PLD, during execution of the first iteration, to initialize shadow memory elements in the PLD with second data, the shadow memory elements respectively shadowing the memory elements in the system; transferring the second data from the shadow memory elements to the memory elements; and executing a second iteration of the system to process the second data.

20 Claims, 6 Drawing Sheets

METHOD AND APPARATUS FOR INITIALIZING A SYSTEM CONFIGURED IN A PROGRAMMABLE LOGIC DEVICE

FIELD OF THE INVENTION

One or more aspects of the present invention relate generally to integrated circuits and, more particularly, to a method and apparatus for initializing a system configured in a programmable logic device (PLD).

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

ICs, such as PLDs, can implement various types of systems. A given system may be used to solve particular problems given particular sets of input data. In some cases, the time it takes to initialize input data into the system for a particular problem to be solved may be significant compared to the amount of time actually taken to process the data and solve the problem. In some cases, problems solved by such systems require the repeated solution of a large number of similarly structured problems. Thus, initialization of input data may directly affect overall throughput of the entire system (e.g., the number of problems solved per second).

Accordingly, there exists a need in the art for a method and apparatus initializing a system implemented in a PLD in a more efficient manner.

SUMMARY OF THE INVENTION

An aspect of the invention relates to a method of initializing a system configured in a programmable logic device (PLD). In some embodiments, the method includes: initializing memory elements in the system with first data; executing a first execution of the first iteration, to initialize shadow memory elements in the PLD with second data, the shadow memory elements respectively shadowing the memory elements in the system; transferring the second data from the shadow memory elements to the memory elements; and executing a second iteration of the system to process the second data.

Another aspect of the invention relates to an apparatus for initializing a system configured in a PLD, the system executing a first iteration to process first data and executing a second iteration to process second data. In some embodiments, the apparatus includes: configuration memory cells for storing the first data to initialize memory elements in the system prior to the first iteration; shadow memory elements respectively shadowing the configuration memory cells; configuration logic for partially reconfiguring the PLD, during execution of the first iteration, to initialize the shadow memory cells with the second data; and means for transferring the second data from the shadow memory cells to the configuration memory cells after the first iteration and prior to the second iteration.

Another aspect of the invention relates to a PLD. The PLD includes: a system configured therein, the system having memory cells and configured to execute a first iteration to process first data and executing a second iteration to process second data; configuration memory cells for storing the first data to initialize the memory elements in the system prior to the first iteration; shadow memory elements respectively shadowing the configuration memory cells; configuration logic for partially reconfiguring the PLD, during execution of the first iteration, to initialize the shadow memory cells with the second data; and means for transferring the second data from the shadow memory cells to the configuration memory cells after the first iteration and prior to the second iteration.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Embodiments of the invention can be used with many types of target integrated circuits having configurable logic. However, for the purpose of illustration of inventive concepts described herein, embodiments are illustrated in the context of programmable logic devices, such as field programmable gate arrays (FPGAs). Throughout this description, the terms "integrated circuit (IC)," "programmable logic device (PLD)," and "field programmable gate array (FPGA)" are used more or less interchangeably. The inventive concepts presented here are, however, applicable to all of the devices described.

Figure 1:
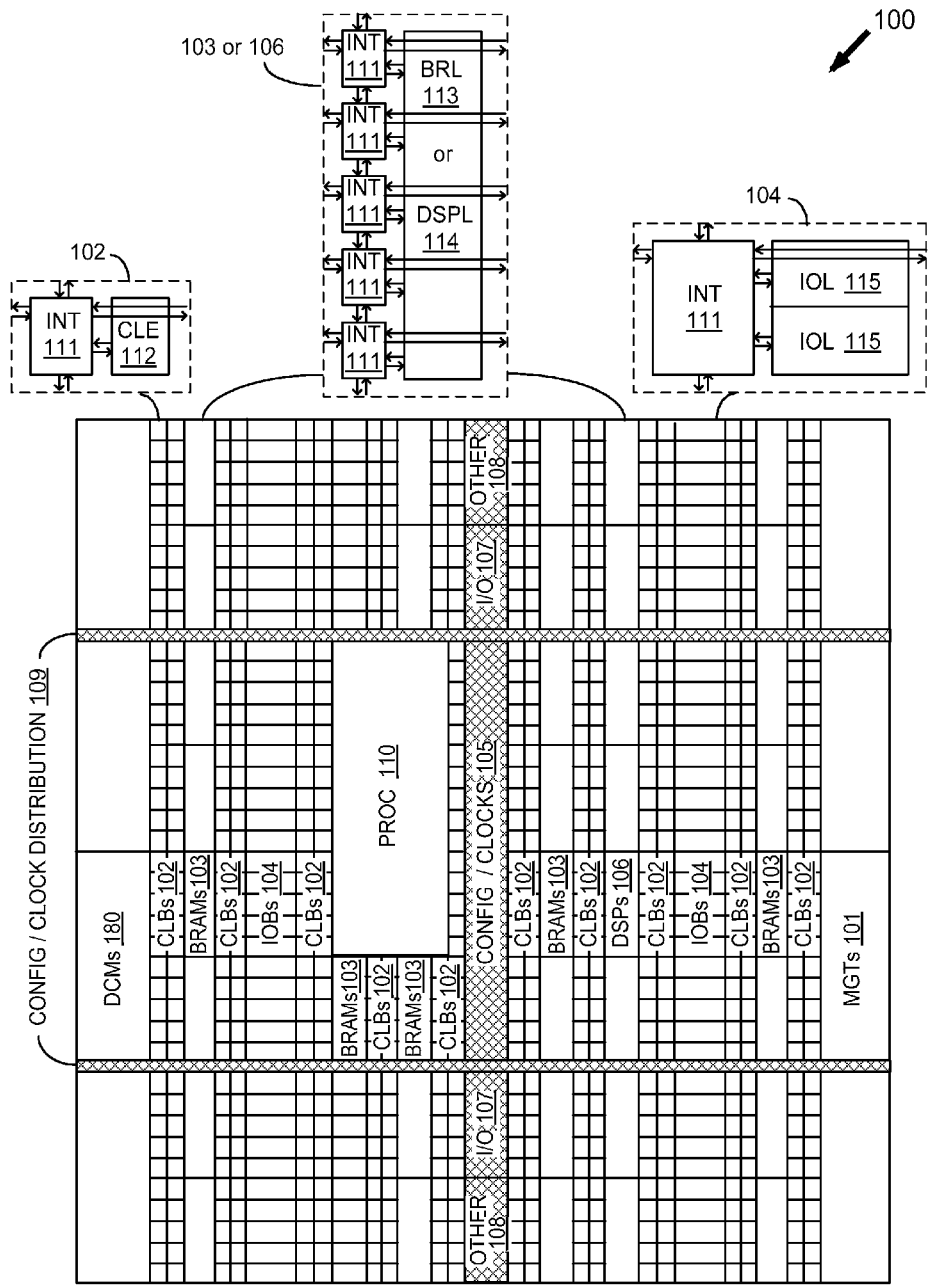
FIG. 1 illustrates an exemplary FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). An exemplary embodiment of a CLE 112 is described below with respect to FIG. 2. A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration/clock logic 105 provides an interface to, and loads configuration data to, the configuration memory. A stream of configuration data ("configuration bitstream") may be coupled to the configuration/clock logic 105, which in turn loads the configuration memory. Notably, the configuration logic 105 is configured to support the loading of partial configuration bitstreams while the FPGA is active. This allows for reconfiguration of portions of the FPGA during runtime (referred to as "partial reconfiguration"). The configuration and partial reconfiguration process for the FPGA is well known in the art. An exemplary embodiment of a configuration system that can be used in the FPGA 100 is described below with respect to FIG. 3.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic. An exemplary FPGA that includes an architecture similar to that of FIG. 1 is the VIRTEX-5 FPGA commercially available from Xilinx, Inc. of San Jose, Calif.

Figure 2:
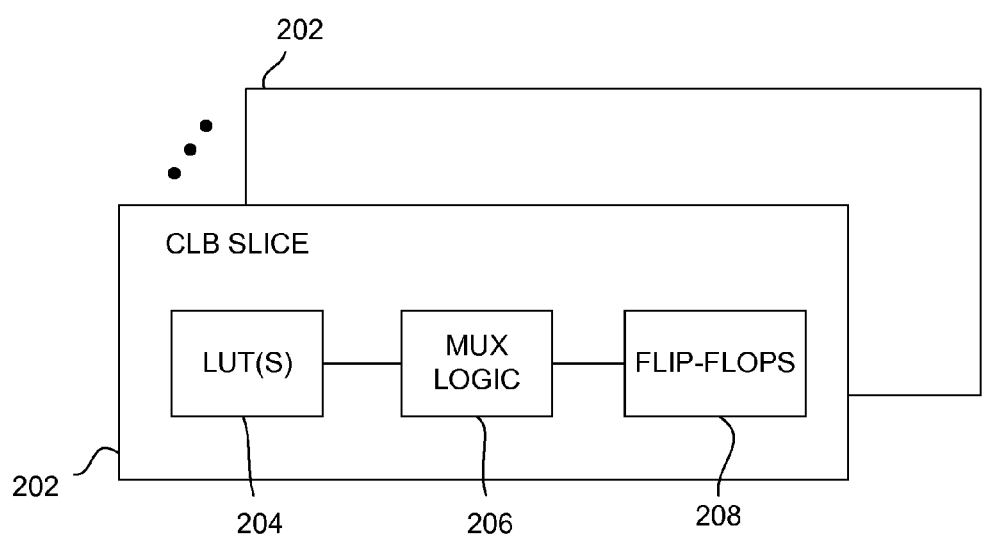
FIG. 2 is a high-level block diagram depicting an exemplary embodiment of a configurable logic element in accordance with one or more aspects of the invention.

FIG. 2 is a high-level block diagram depicting an exemplary embodiment of the CLE 112 of a CLB 102 in accordance with one or more aspects of the invention. The CLE 112 includes one or more logic slices 202. Each of the slices 202 may include a plurality of lookup tables (LUTs) 204, multiplexer logic 206, and a plurality of flip-flops 208. Inputs of the LUTs 204 are configured to receive input signals to the CLE 112 (e.g., signals from the interconnect element 111). Outputs of the LUTs 204 are coupled to inputs of the multiplexer logic 206. Outputs of the multiplexer logic 206 are coupled to inputs of the flip-flops 208. Outputs of the flip-flops 208 are configured to provide output signals of the CLE 112 (e.g., signals coupled to the interconnect element 111). Each of the LUTs 204 may be configured to perform various types of logic functions of its inputs to produce its outputs. The outputs of the LUTs 204 may be selectively coupled to the flip-flops 208 via the multiplexer logic 206. Notably, each of the LUTs 204 may be functionally configured to implement different types of memory circuits, such as LUT random access memories (RAMs), shift registers, and the like.

Figure 3:
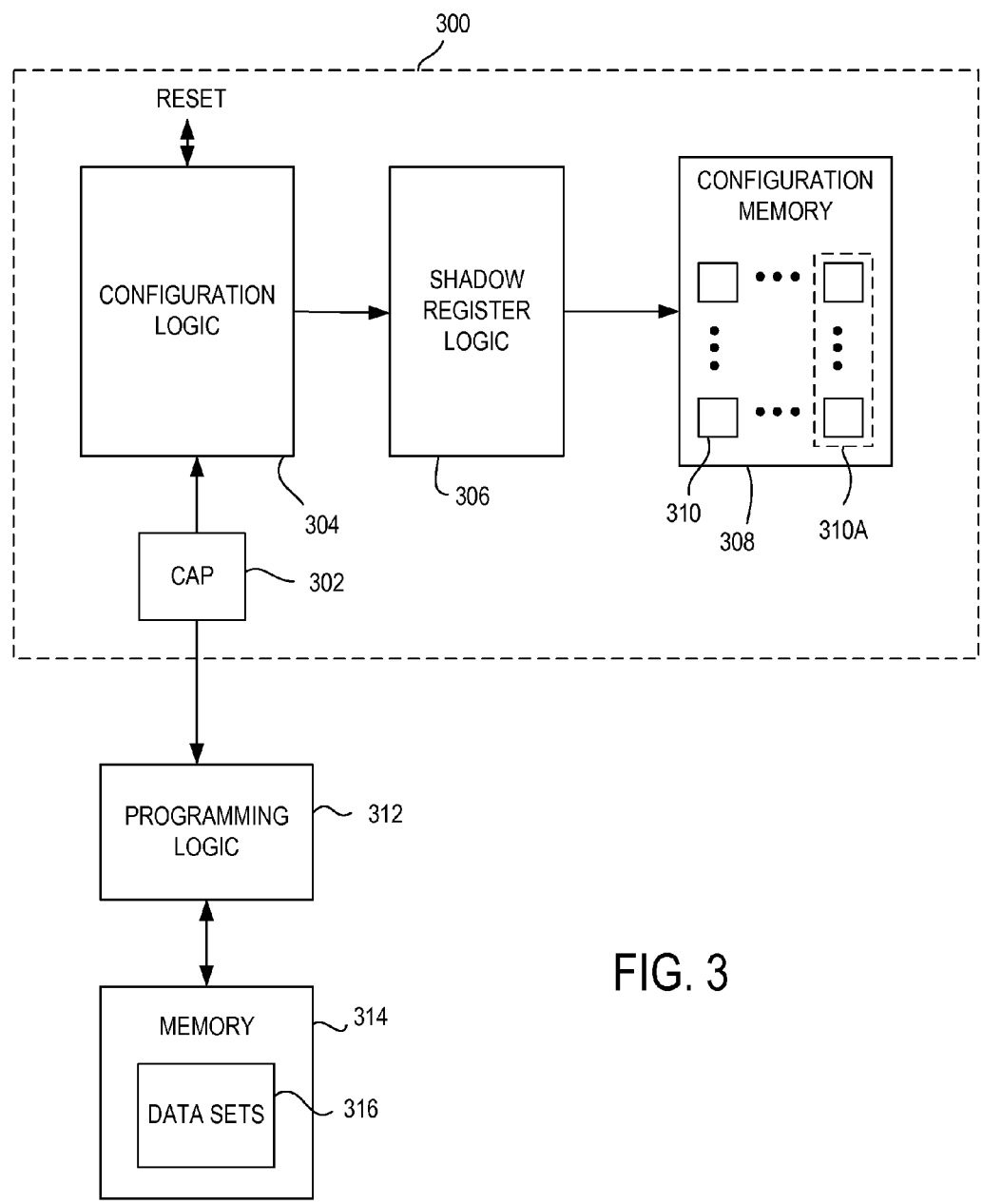
FIG. 3 is a block diagram depicting an exemplary embodiment of a configuration system for a PLD in accordance with one or more aspects of the invention.

FIG. 3 is a block diagram depicting an exemplary embodiment of a configuration system 300 for an integrated circuit having configurable logic, such as a PLD, in accordance with one or more aspects of the invention. The configuration system 300 may also be included in an FPGA having the architecture shown in FIG. 1. The configuration system 300 includes a configuration access port (CAP) 302, configuration logic 304, shadow register logic 306, and configuration memory 308. The CAP 302 provides an input interface for receiving configuration bitstreams. The CAP 302 is coupled to the configuration logic 304. The configuration logic 304 receives configuration bitstreams from the CAP 302 and controls the loading of configuration data into the configuration memory 308. Each configuration bitstream can be a full bitstream for fully programming the FPGA 100, or a partial bitstream for partially programming the FPGA 100. As noted above, partial configuration may be active and dynamic, i.e., performed while the FPGA 100 is active and configured to perform a partial reconfiguration. The configuration data may be provided by programming logic 312, which may operate as described below.

The configuration memory 308 may comprise a static random access memory (SRAM) or other type of RAM having an array of configuration memory cells 310. A configuration memory cell 310 can store a data bit that controls some element in the programmable logic or programmable interconnect of the FPGA 100. The configuration memory cells 310 can be arranged in frames, where a frame programs all or a portion of a column in the programmable fabric of the FPGA 100. Thus, the configuration data in a configuration bitstream may be divided into a sequence of configuration data frames.

The configuration logic 304 may control the configuration process by repeatedly addressing particular configuration memory cells 310 in the configuration memory 308 and loading configuration data thereto. For example, the configuration logic 304 can address and load the configuration data into the configuration memory 308 on a frame-by-frame basis. The shadow register logic 306 can be used to store configuration data prior to such data being written to the configuration memory 308. The shadow register logic 306 can be used during the configuration process to load first configuration data to the configuration memory 308 while second configuration data is being received by the configuration logic 304. The shadow register logic 306 can store one or more frames of configuration data to be loaded to the configuration memory 308. For example, the shadow register logic 306 may include shadow registers 318 respectively corresponding to memory cells 310 in a frame.

Figure 4:
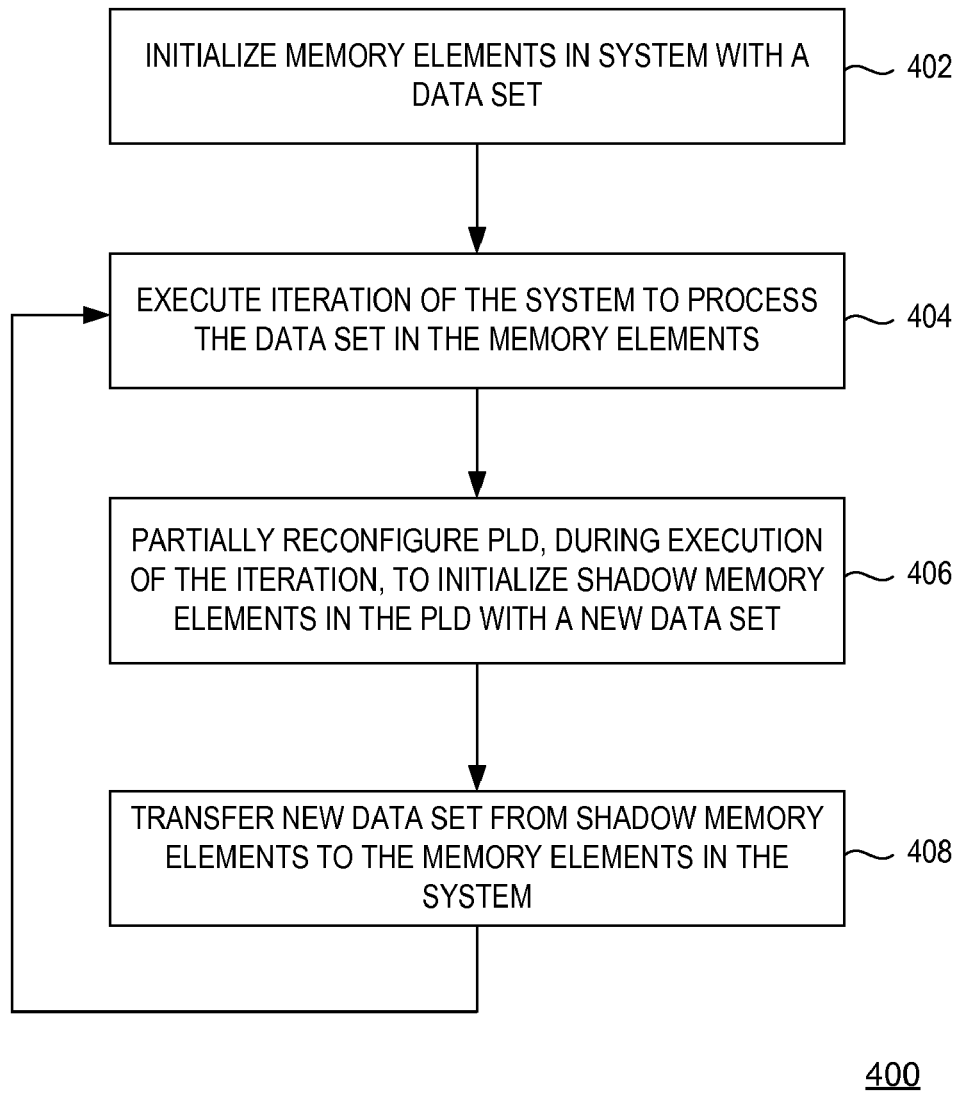
FIG. 4 is a flow diagram depicting an exemplary embodiment of a method of initializing a system configured in a PLD in accordance with one or more aspects of the invention.

FIG. 4 is a flow diagram depicting an exemplary embodiment of a method 400 of initializing a system configured in an integrated circuit in accordance with one or more aspects of the invention. The method 400 beings at step 402, where memory elements in the system are initialized with a data set. At step 404, an iteration of the system is executed to process the data set in the memory elements. At step 406, the integrated circuit is partially reconfigured, during execution of the iteration, to initialize shadow memory elements in the integrated circuit with a new data set. The shadow memory elements respectively shadow the memory elements in the system. At step 408, the new data set is transferred from the shadow memory elements to the memory elements in the system. The method 400 returns to step 404 and repeats.

The method 400 may be repeated for any number of data sets. For example, one iteration of the method 400 results in the memory elements initialized with first data, a first iteration of the system executed to process the first data, a partial reconfiguration of the integrated circuit performed to initialize the shadow memory elements with second data, the second data transferred to the memory elements, and a second iteration of the system executed to process the second data. Exemplary implementations of the method 400 are described below.

Figure 5:
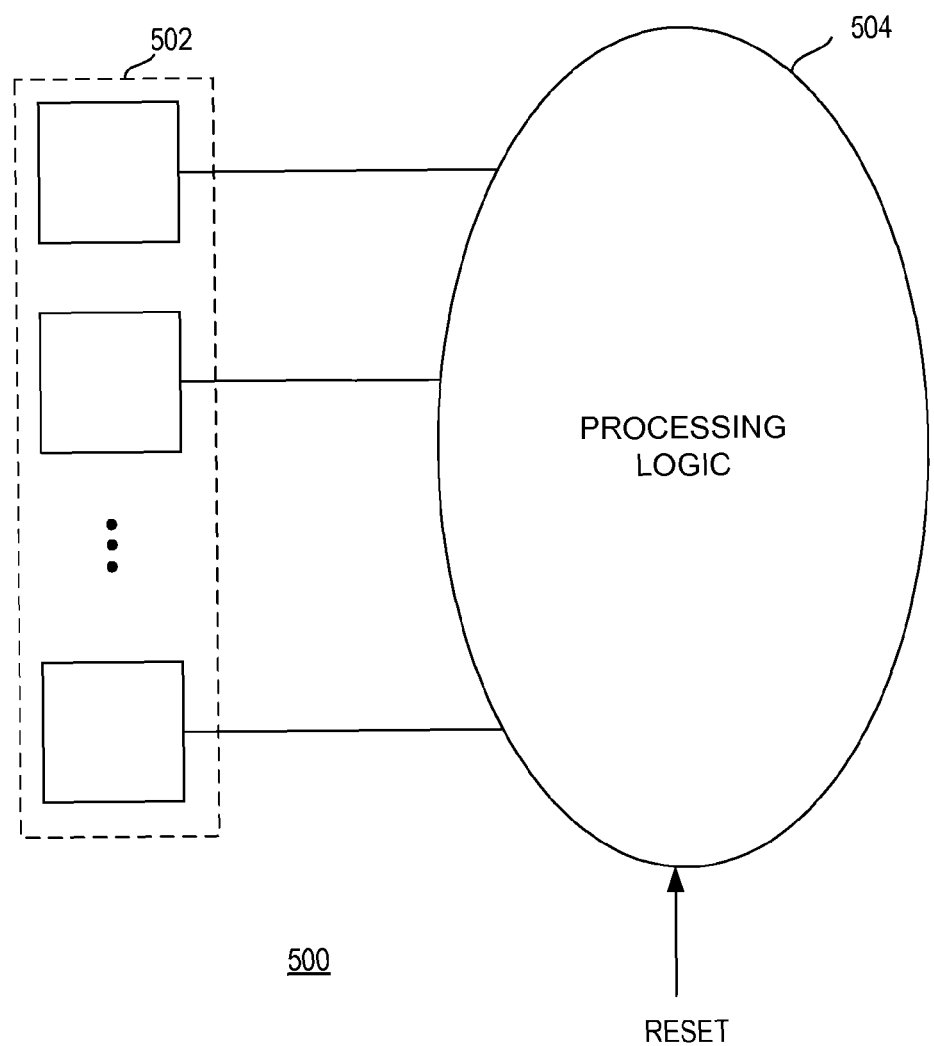
FIG. 5 is a block diagram depicting an exemplary embodiment of a system configured in a PLD in accordance with one or more aspects of the invention.

FIG. 5 is a block diagram depicting an exemplary embodiment of a system 500 configured in a integrated circuit in accordance with one or more aspects of the invention. The system 500 includes a plurality of flip-flops 502 coupled to processing logic 504. The system 500 may be configured in a PLD, such as the FPGA 100 using the programmable resources therein. For example, the flip-flops 502 can be implemented using flip-flops in CLBs, and the processing logic 504 can be implemented using any of the various resources in the FPGA 100, such as CLBs, IOBs, BRAMs, DSPs, processors, and the like. In general, the flip-flops 502 are configured to store an initial data set to be processed by the processing logic 504. The processing logic 504 accesses the flip-flops 502 to retrieve the initial data set, processes the initial data set, and produces some output data in response to processing the initial data set. The flip-flops 502 are part of a reconfigurable portion of the system 500. In some embodiments, the system 500 is responsive to a reset signal such that the system 500 does not operate when the reset signal is asserted. This allows the flip-flops 502 to be loaded with a data set without glitching or otherwise affecting operation of the processing logic 504.

The system 500 can have a myriad of possible implementations for processing various types of data. The only assumption is that a given execution ("iteration") of the system 500 requires an initial set of data to be loaded to the flip-flops 502. The system 500 may perform multiple iterations by sequentially loading the flip-flops 502 with different initial sets of data.

An exemplary implementation of the method 400 may be understood with reference to FIGS. 1-5 above. Assume for purposes of exposition that the FPGA 100 is configured with the system 500. In some embodiments, the flip-flops 502 may be loaded with an initial data set during full configuration of the FPGA 100 with the system 500 (step 402). That is, the initial data set may be part of the full configuration bitstream used to load the system 500 to the FPGA 100. Alternatively, the initial data set may be loaded using a partial configuration process, as described below. In either case, the flip-flops 502 are initialized by loading configuration data having the initial data set into particular configuration memory cells 310 that correspond to the flip-flops 502 (designated as memory cells 310A). The memory cells 310A comprise all or a portion of each of one or more frames.

Once the flip-flops 502 are loaded with the initial data set, the processing logic 504 executes an iteration to process the data (step 404). The programming logic 312 may be coupled to a memory 314 that stores a plurality of data sets 316. While the processing logic 504 is executing, the programming logic 312 can retrieve a data set from the memory 314 and generate a partial configuration bitstream, which is then coupled to the CAP 302. Alternatively, the data sets 316 in the memory 314 may be formatted into partial configuration bitstreams, which the programming logic 312 may retrieve and load to the CAP 302. The partial configuration bitstream includes an instruction that commands the configuration logic 304 to load the data set in the partial configuration bitstream to the shadow register logic 306 (step 406).

When the processing logic 504 completes execution of the iteration, the configuration logic 304 transfers the data set from the shadow register logic 306 to the memory cells 310A for the flip-flops 502 (step 408). In some embodiments, both the system 500 and the configuration logic 304 are responsive to a reset signal. When the reset signal is asserted, the system 500 suspends operation and the configuration logic 304 transfers the data set from the shadow register logic 306 to the memory cells 310A. The reset signal may be triggered by the programming logic 312. For example, the programming logic 312 may be configured to receive an indication from the processing logic 504 that execution of an iteration is complete (e.g., a done signal or detection of output data). Upon such an indication, the programming logic 312 asserts the reset signal. The programming logic 312 can de-assert the reset signal upon receiving an indication from the configuration logic 304 that the transfer of the data set is complete. After the data set is transferred to the memory cells 310A, the flip-flops 502 are loaded with a new data set and the processing logic 504 executes another iteration to process the new data set (step 404).

In this manner, the partial reconfiguration mechanism of a PLD is used to double buffer the storage elements used to contain the data set being processed. A new data set can be read into the shadow register logic 306 while the previous data set is being processed. Once the processing of the previous data set is complete, the new data set is transferred from the shadow register logic 306 to the storage elements of the system 500, at which point the next iteration can begin. Thus, partial reconfiguration is used to pipeline the processing of one set of data with the initialization of the next set of data, which increases the overall throughput of the system 500. As described above, the shadow register logic 306 and the configuration logic 304 are part of the configuration subsystem in a PLD, such as the FPGA 100. Thus, registers and control logic already existing in the FPGA 100 can be leveraged to initialize the system 500, rather than using special purpose registers synthesized into the design of the system 500. Note that the effectiveness of the initialization mechanism can be limited by the bandwidth of the configuration interface of the PLD. That is, for maximum effectiveness, the partial reconfiguration process (e.g., loading of the shadow register logic 306 with the next data set) should be performed faster than the time it takes to process the previous data set, or else the pipeline will exhibit stalls.

The programming logic 312 and/or the memory 314 may be implemented external to the PLD or internal to the PLD. For example, the programming logic 312 and/or the memory 314 may be implemented using the programmable resources of the FPGA 100 described above.

In some PLDs, the configuration logic 304 loads the configuration data on a frame-by-frame basis, which results in a frame being the minimum unit of configuration data capable of being changed by partial reconfiguration. In some PLD architectures, bits that control flip-flop state may not be densely packed within a frame. For example, a PLD may include an 80-bit configuration frame, with only 8 bits used to initialize flip-flop values. If the system 500 requires more flip-flops, then the configuration system 300 needs to buffer multiple frames in the shadow register logic 306. In addition, the sparseness of the bits that control flip-flop state in a frame require more "don't care" bits to be formed in the partial configuration bitstream, which can increase the duration of the partial reconfiguration process.

Figure 6:
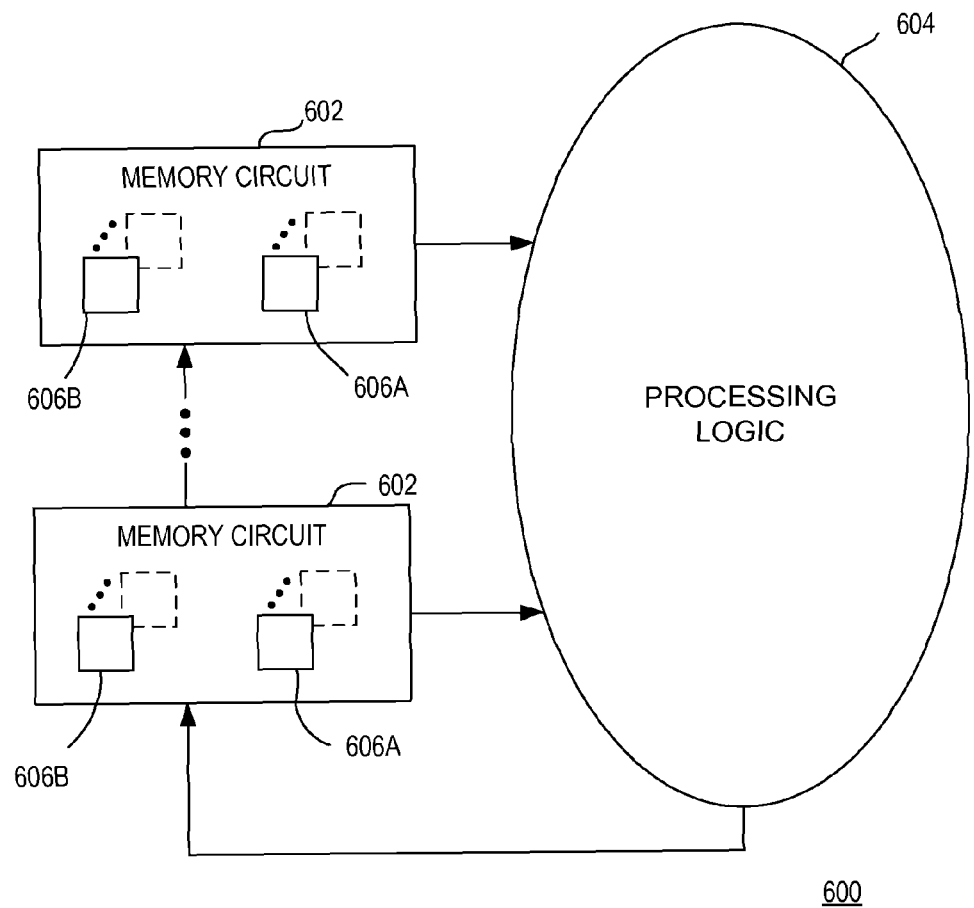
FIG. 6 is a block diagram depicting another exemplary embodiment of a system configured in a PLD in accordance with one or more aspects of the invention.

FIG. 6 is a block diagram depicting an exemplary embodiment of a system 600 configured in a PLD in accordance with one or more aspects of the invention. The system 600 includes a plurality of memory circuits 602 coupled to processing logic 604. The system 600 may be configured in a PLD, such as the FPGA 100 using the programmable resources therein. In some embodiments, the memory circuits 602 may comprise shift registers. Shift registers may be implemented using the LUT logic 204, as described above. In some embodiments, the memory circuits 602 may comprise lookup table RAM (LUTRAM) implemented using the LUT logic 204. In some embodiments, the memory circuits 602 may comprise BRAM (e.g., the BRAM 103). The processing logic 504 can be implemented using any of the various resources in the FPGA 100, such as CLBs, IOBs, BRAMs, DSPs, processors, and the like.

In general, the memory circuits 602 include a plurality of memory locations 606 for storing data. One or more of the locations 606 in each of the memory circuits 602 may be used to store an initial data set to be processed by the processing logic 604 (designated as location(s) 606A). One or more others of the locations 606 in each of the memory circuits 606 may be used as shadow memory elements, as described below (designated as location(s) 606B). The processing logic 604 accesses the memory circuits 602 to retrieve the initial data set, processes the initial data set, and produces some output data in response to processing the initial data set. The memory circuits 602 are part of a reconfigurable portion of the system 600.

The system 600 can have a myriad of possible implementations for processing various types of data. The only assumption is that a given execution ("iteration") of the system 600 requires an initial set of data to be loaded to the memory circuits 602. The system 600 may perform multiple iterations by sequentially loading the memory circuits 602 with different initial sets of data. The processing logic 604 may generate a done signal when processing of a given data set is complete and the processing logic 604 requires a new data set. Alternatively, presence of new output data may be used as an indication that the processing logic 604 has completed processing a given data set.

An exemplary implementation of the method 400 may be understood with reference to FIGS. 1-4 and 6 above. Assume for purposes of exposition that the FPGA 100 is configured with the system 600. In some embodiments, the locations 606A of the memory circuits 602 may be loaded with an initial data set during full configuration of the FPGA 100 with the system 600 (step 402). That is, the initial data set may be part of the full configuration bitstream used to load the system 600 to the FPGA 100. Alternatively, the initial data set may be loaded using a partial configuration process, as described. In either case, the locations 606A of the memory circuits 602 are initialized by loading configuration data having the initial data set into particular configuration memory cells 310 that correspond to the locations 606A of the memory circuits 602 (designated as the memory cells 310A). The memory cells 310A comprise all or a portion of each of one or more frames.

Once the locations 606A of the memory circuits 602 are loaded with the initial data set, the processing logic 604 executes an iteration to process the data (step 404). As described above, the programming logic 312 may be coupled to a memory 314 that stores a plurality of data sets 316. While the processing logic 604 is executing, the programming logic 312 can retrieve a data set from the memory 314 and provide a partial configuration bitstream having the data set to the CAP 302. The partial configuration bitstream includes an instruction that commands the configuration logic 304 to load the data set in the partial configuration bitstream to the shadow memory elements 606B of the memory circuits 602 (step 406). This may be achieved by loading the data set to the particular ones of the memory cells 310 corresponding to the shadow memory elements 606B if the memory circuits 602.

When the processing logic 604 completes execution of the iteration, the memory circuits 602 transfer the data set from the shadow elements 606B to the locations 606A (step 408). In some embodiments, the system 500 is configured to signal the memory circuits 602 to initiate the transfer upon completion of the iteration. After the data set is transferred to the locations 606A of memory circuits 602, the processing logic 604 executes another iteration to process the new data set (step 410).

In some PLD architectures, multiple bits in a partial configuration bitstream may be needed to set an initial state of a flip-flop, whereas only a single bit may be needed to set a location of a memory circuit, such as a shift register, LUTRAM, or BRAM. In such case, the partial reconfiguration process may occur more quickly if such memory circuits are used instead of flip-flops, since fewer bits would be required for the reconfiguration and loading of the new data set. Further, as described above, the configuration logic 304 in some PLDs loads the configuration data on a frame-by-frame basis, which results in a frame being the minimum unit of configuration data capable of being changed by partial reconfiguration. Thus, it is desirable to have the bits in the partial configuration bitstream that represent the new data set to be as densely packed in the frames as possible. This would reduce the number of "don't care" bits coupled to the CAP 302. In some PLD architectures, the configuration memory cells for the memory circuits 602 are more densely packed in a frame than flip-flops. For example, if a frame is 80 bits, then the frame may only be able to initialize 8 flip-flops, but may contain bits for initializing 64 bits of a memory circuit.

The above described embodiments of initialization may be used for various types of systems. In one example, the systems may be configured as a semi-systolic system for solving problems. An example problem is the solving of matrix equations using Gaussian elimination. Those skilled in the art will appreciate that the invention is applicable to various other types of problems. Typically, the problem of solving matrix equations using Gaussian elimination (or like type problems) involves the solving of many problem sets, and hence a significant proportion of execution time is spent in initializing the problem sets into a semi-systolic array. Embodiments of the invention described above may be used to pipeline the initialization of semi-systolic problems with computation in an architecture that results in minimal impact on the original design of the system by leveraging the partial reconfiguration architecture of the PLD. Embodiments of the invention described above may also be useful as a more general mechanism for setting and resetting the state of an arbitrary system without providing synthesized wires for this functionality, particularly in cases where the state on reset is independent of the current execution of the system.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of initializing a system configured in an integrated circuit having configurable logic, wherein logic functions performed by the configurable logic of the integrated circuit are programmed with configuration information stored in configuration memory by configuration circuitry of the integrated circuit in response to a configuration bitstream input at a configuration access port of the integrated circuit, comprising:

initializing memory elements in the configuration memory with first data by the configuration circuitry of the integrated circuit in response to a first configuration bitstream input to the configuration access port;

executing a first iteration of the system to process the first data as input data to the system;

during execution of the first iteration, initializing shadow memory elements in the integrated circuit with second data by the configuration circuitry of the integrated circuit in response to a second configuration bitstream input to the configuration access port and the second configuration bitstream including an instruction that specifies loading of the second data to the shadow memory elements, the shadow memory elements respectively shadowing the memory elements in the configuration memory;

transferring the second data from the shadow memory elements to the memory elements in the configuration memory;

wherein the second data replaces the first data in the memory elements in the configuration memory; and executing a second iteration of the system to process the second data as input data to the system.

2. The method of claim 1, wherein the memory elements in the system comprise flip-flops in the integrated circuit, and wherein the step of initializing comprises:

loading first configuration data having the first data into configuration memory cells in the integrated circuit corresponding to the flip-flops.

3. The method of claim 2, wherein the shadow memory elements comprise shadow registers respectively coupled to the configuration memory cells, and wherein the step of partially reconfiguring comprises:

loading second configuration data having the second data into the shadow registers.

4. The method of claim 3, wherein the step of transferring comprises:

asserting a reset signal in the integrated circuit.

5. The method of claim 1, wherein the memory elements in the system comprise first locations in memory circuits in the integrated circuit, and wherein the shadow memory elements comprise second locations in the memory circuits.

6. The method of claim 5, wherein each of the memory circuits comprises one of a shift register, a lookup table (LUT) random access memory (RAM), or a block RAM (BRAM) in the integrated circuit.

7. The method of claim 5, wherein the step of transferring comprises:

shifting the second data from the second locations in the memory circuits to the first locations in the memory circuit.

8. Apparatus for initializing a system configured in an integrated circuit having configurable logic, the system executing a first iteration to process first data as input data to the system and executing a second iteration to process second data as input data to the system, the apparatus comprising:

a configuration access port;

configuration memory cells for storing input data to the system and for storing configuration information that programs logic functions performed by the configurable logic;

shadow memory elements configured to respectively shadow a subset of the configuration memory cells;

configuration logic coupled to the configuration access port, the configuration memory cells, and to the shadow memory elements, wherein the configuration logic is configured and arranged to:

store configuration information in the configuration memory cells that programs the configurable logic in response to the configuration information input at the configuration access port;

store the first data in the subset of the configuration memory cells in response to a first configuration bitstream input to the configuration access port; and during execution of the first iteration, initialize the shadow memory elements with the second data in response to a second configuration bitstream input to the configuration access port and the second configuration bitstream including an instruction that specifies loading of the second data to the shadow memory elements;

and means for transferring the second data from the shadow memory elements to the subset of configuration memory cells after the first iteration and prior to the second iteration.

9. The apparatus of claim 8, wherein the memory elements in the system comprise flip-flops in the integrated circuit, and wherein the configuration memory cells are configured to program the flip-flops.

10. The apparatus of claim 9, wherein the shadow memory elements comprise shadow registers respectively coupled to the configuration memory cells.

11. The apparatus of claim 10, wherein the means for transferring comprises the configuration logic, and wherein the configuration logic is configured to transfer the second data from the shadow registers to the configuration memory cells in response to assertion of a reset signal in the integrated circuit.

12. The apparatus of claim 8, further comprising:
a configuration access port for receiving a first configuration stream having the first data and a second configuration stream having the second data.

13. The apparatus of claim 8, wherein the integrated circuit includes memory circuits, wherein the configuration memory cells comprise first locations in the memory circuits, and wherein the shadow memory elements comprise second locations in the memory circuits.

14. The apparatus of claim 13, wherein each of the memory circuits comprises one of a shift register, a lookup table (LUT) random access memory (RAM), or a block RAM (BRAM) in the integrated circuit.

15. The apparatus of claim 14, wherein the means for transferring comprises the memory circuits, and wherein the memory circuits are configured to transfer the second data from the shadow registers to the configuration memory cells in response to a shift signal.

16. An integrated circuit, comprising:
a system configured therein, the system configured to execute a first iteration to process first data as input data to the system and execute a second iteration to process second data as input data to the system;
configurable logic;
a configuration access port;
configuration memory cells for storing the input data to and for storing configuration information that programs logic functions performed by the configurable logic;
shadow memory elements configured to respectively shadow a subset of the configuration memory cells;
configuration logic coupled to the configuration access port, the configuration memory cells, and to the shadow memory elements, wherein the configuration logic is configured and arranged to:
store configuration information in the configuration memory cells that programs the configurable logic in response to the configuration information input at the configuration access port;
store the first data in the subset of the configuration memory cells in response to a first configuration bitstream input to the configuration access port; and
during execution of the first iteration, initialize the shadow memory cells with the second data in response to a second configuration bitstream input to the configuration access port and the second configuration bitstream including an instruction that specifies loading of the second data to the shadow memory elements;
and
means for transferring the second data from the shadow memory elements to the subset of configuration memory cells after the first iteration and prior to the second iteration.

17. The integrated circuit of claim 16, wherein the memory elements in the system comprise flip-flops in the integrated circuit, wherein the configuration memory cells are configured to program the flip-flops, and wherein the shadow memory elements comprise shadow registers respectively coupled to the configuration memory cells.

18. The integrated circuit of claim 17, wherein the means for transferring comprises the configuration logic, and wherein the configuration logic is configured to transfer the second data from the shadow registers to the configuration memory cells in response to assertion of a reset signal in the integrated circuit.

19. The integrated circuit of claim 18, further comprising:
memory circuits, each of the memory circuits comprising one of a shift register, a lookup table (LUT) random access memory (RAM), or a block RAM (BRAM);
wherein the configuration memory cells comprise first locations in the memory circuits, and wherein the shadow memory elements comprise second locations in the memory circuits.

20. The integrated circuit of claim 19, wherein the means for transferring comprises the memory circuits, and wherein the memory circuits are configured to transfer the second data from the shadow registers to the configuration memory cells in response to a shift signal.

* * * * *